(12) United States Patent
Patland et al.

(10) Patent No.: US 8,427,929 B2
(45) Date of Patent: Apr. 23, 2013

(54) SUB-OPTICAL-RESOLUTION KERR SIGNAL DETECTION FOR PERPENDICULAR WRITE-HEAD CHARACTERIZATION

(75) Inventors: Henry Patland, Los Gatos, CA (US); Juergen Heidmann, Salinas, CA (US); Wade A. Ogle, San Jose, CA (US); Alexander M. Taratorin, Palo Alto, CA (US)

(73) Assignee: Infinitum Solutions, Inc., Santa Clara, CA (US)

(*) Notice: Subject to any disclaimer, the term of this patent is extended or adjusted under 35 U.S.C. 154(b) by 0 days.

(21) Appl. No.: 13/227,414

(22) Filed: Sep. 7, 2011

(65) Prior Publication Data
US 2012/0057446 A1  Mar. 8, 2012

Related U.S. Application Data (60) Provisional application No. 61/381,024, filed on Sep. 8, 2010, provisional application No. 61/503,585, filed on Jun. 30, 2011.

(51) Int. Cl.
*G11B 7/00* (2006.01)
*G01R 33/032* (2006.01)

(52) U.S. Cl.
USPC ......................... 369/126; 324/244.1

(58) Field of Classification Search ............. 369/126, 369/116, 143, 13.13, 13.01, 13.37; 850/48; 324/244.1; 356/364, 237.2, 369, 280, 281
See application file for complete search history.

(56) References Cited

U.S. PATENT DOCUMENTS

| | | | |
|---|---|---|---|
| 4,896,103 A | 1/1990 | Shimanuki et al. | |
| 5,212,446 A | 5/1993 | Itoh et al. | |
| 5,631,559 A | 5/1997 | Oliver et al. | |
| 5,663,652 A | 9/1997 | Freeman | |
| 5,835,257 A | 11/1998 | Itoh et al. | |
| 5,969,517 A | 10/1999 | Rao | |
| 6,084,396 A | 7/2000 | Rao | |
| 6,141,093 A | 10/2000 | Argyle et al. | |
| 6,934,068 B2 | 8/2005 | Kochergin | |
| 7,271,900 B2 | 9/2007 | Decitre et al. | |
| 2010/0170017 A1* | 7/2010 | Heidmann | 850/48 |

* cited by examiner

*Primary Examiner* — Nabil Hindi
(74) *Attorney, Agent, or Firm* — Silicon Valley Patent Group LLP (57) ABSTRACT

A property, such as a quality parameter, of a write pole in a write head is determined using an optical metrology device, where the write pole is smaller than the optical resolution limit of the metrology device. The metrology device produces polarized light that is reflected off the write pole while the write pole is magnetized either during or after excitation with a write current. The magnetization alters the polarization state of the light, which can be analyzed to transform the altered polarization state into intensity. The intensity of the light is detected over the point spread function of the optics in the metrology device and an intensity value is generated. The intensity value is used to determine the quality parameter of the write pole, e.g., by comparison to a threshold or reference intensity value, which may be generated empirically or theoretically.

76 Claims, 10 Drawing Sheets

SUB-OPTICAL-RESOLUTION KERR SIGNAL DETECTION FOR PERPENDICULAR WRITE-HEAD CHARACTERIZATION

CROSS REFERENCE TO RELATED APPLICATIONS

This application claims the benefit of U.S. Provisional Application No. 61/381,024, filed Sep. 8, 2010, and U.S. Provisional Application No. 61/503,585, filed Jun. 30, 2011, both of which are incorporated by reference herein in their entireties.

BACKGROUND

As technology advances, devices continue to shrink in size and it becomes increasingly difficult to test or verify the operation of the devices. One example of this is found in storage systems based on magnetic recording technology, which is commonly used in devices such as computers and digital electrical household appliances, including digital video recorders (DVRs) or personal video recorders (PVRs). In operation, a magnetic write head is used to magnetize bits of data on a recording medium, commonly referred to as a hard disk, while a read sensor is used to read the bits of data from the hard disk.

It is desirable to test devices, such as write heads, early in the manufacturing process to increase yield and reduce costs. However, as devices, such as write heads, continue to shrink in size it is increasingly difficult to perform accurate measurements early in the manufacturing process. For example, a write head includes several small elements, such as a write pole, return pole/shield, etc. The write pole in particular has a size that is below the resolution of conventional optical imaging techniques. Accordingly, to image the write pole, typically a scanning electron microscope (SEM) is used. However, SEM is an expensive, time consuming test that is potentially destructive. Another method of testing a writer is with Magnetic Force Microscopy (MFM), where an MFM probe scans across the surface of the write pole while the writer is excited with a current. Alternatively, a spin-stand is sometimes used to test the write head. However, a spin-stand test is also an expensive and time-consuming test.

SUMMARY

A quality parameter of a write pole in a write head is determined using an optical metrology device, where the write pole is smaller than the optical resolution limit of the metrology device. The metrology device produces polarized light that is reflected off the write pole while the write pole is magnetized and the intensity of the light registered by the optical metrology device is determined by its point spread function. The magnetization alters the polarization state of the light, which can be analyzed to convert the altered polarization state into intensity after the analyzer and the intensity value is measured. The intensity value is measured after the analyzer and is used to determine the quality parameter of the write pole, e.g., by comparison to a threshold or reference intensity value, which may be generated empirically or theoretically.

DETAILED DESCRIPTION

Figure 1:
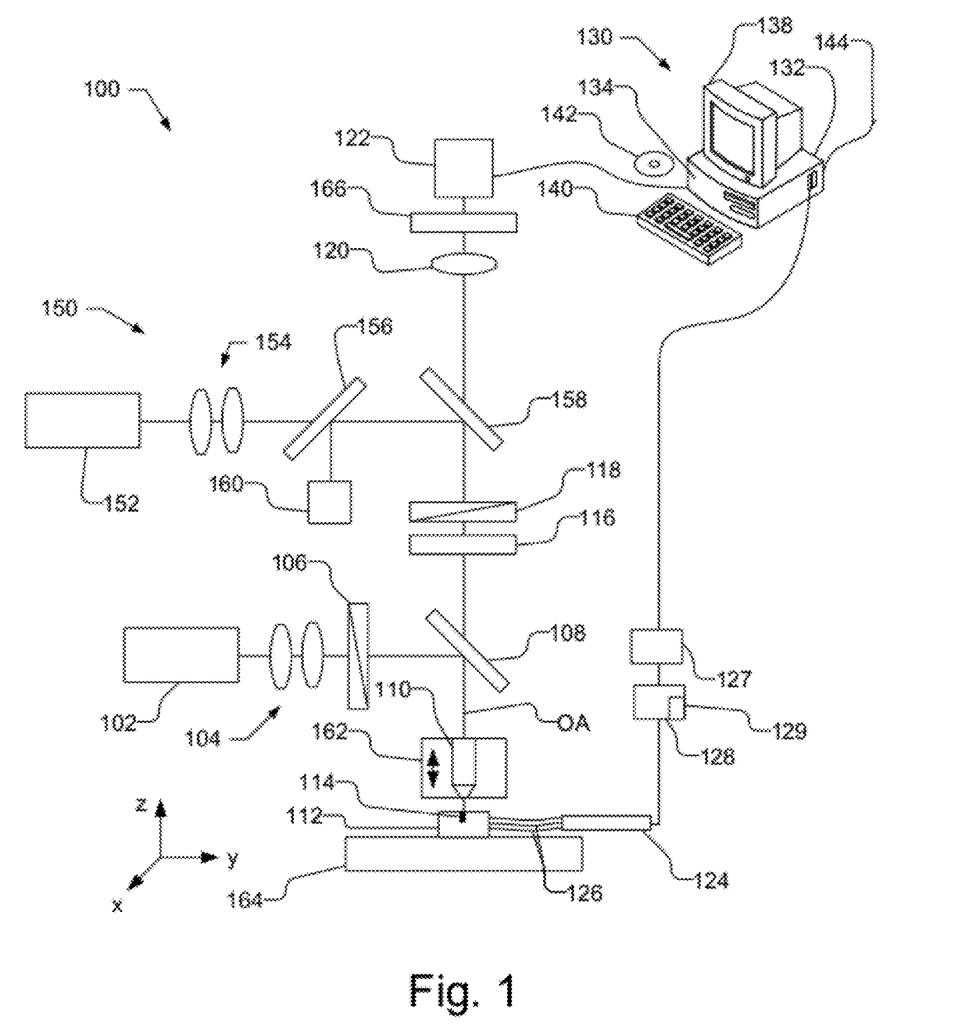
FIG. 1 illustrates an optical metrology device to detect the magnetization of a write pole of a write head, where the write pole is below the resolution limit of the optical metrology device.

FIG. 1 illustrates an optical metrology device 100 to detect the magnetization of a write pole of a write head, where the write pole dimensions are below the resolution limit of the optical metrology device 100. Thus, while imaging the write pole is not possible with metrology device 100 because the write pole is sub-resolution, the metrology device 100 optically detects the magnetization of the write pole, from which a property of the write head, such as one or more quality parameters, can be determined. The device 100 may be a polarization microscope, such as a magneto-optic microscope system that uses the Kerr effect, and may be, e.g., a white field microscope, a confocal microscope, or a scanning microscope.

The device 100 includes a light source 102, which may be a laser, light emitting diode (LED), or laser diode and may have a wavelength of, e.g., 445 nm. If desired, other wavelengths may be used including wavelengths in the non-visible region of the spectrum, e.g., UV or DUV. Moreover, if desired, multiple wavelengths maybe used from multiple light sources or from a broadband light source. When a laser is used as the light source 102, the coherence of the laser light has to be reduced or eliminated to avoid speckles and diffraction artifacts in the image. The coherence of the laser light can be reduced by one or more of the following; vibrating an optical fiber through which the light is transmitted, modulating the laser at a frequency of e.g. 250 MHz, using a dynamic mirror with an oscillating membrane, or by inserting an optical diffuser in the illuminating light path. In a different approach, a multimode laser diode can be used to reduce light coherence with or without the previous measures implemented.

The light from the light source 102 is provided to a collimator 104 either directly or by way of an intervening optical element, e.g., fiber optics or a light pipe. The collimator 104 expands and collimates the light, which is polarized by polarizer 106. In an embodiment in which the device is a confocal polarization microscope, the one or more movable lenses may be included along with one or more apertures. A beam splitter 108 reflects a portion of the light and the light is focused by an objective lens 110, e.g., at a normal angle of incidence on the write head 112. It should be understood, however, that an oblique angle of incidence may be used with an appropriate adjustment of the optics in device 100. The objective lens 110 focuses the light onto the write pole 114 of the write head 112. The write head 112 may be held on a stage 164 that adjusts the position (x, y) of the write head 112 to align the write pole 114 with the optical axis (OA). The stage 164 may further adjust the vertical (z) height of the write head 112 for focusing if desired.

The light reflected from the write pole 114 passes back through the objective lens 110 and is transmitted through the beam splitter 108. The light passes through an optional quarter wave plate 116 and another polarizer, referred to as analyzer 118, analyzes the polarization state of the returned light, which is then focused by lens 120 onto an optical detector 122. By way of example, the polarizer 106 and the analyzer 118 may be set to have an angle difference of ±90°. In one implementation, the orientation of the polarizer 106 and analyzer 118 is automatically adjusted by a motorized, computer controlled stage to adjust for a variability in the optical properties of the write head ABS in order to maximize the magneto-optic contrast. In one embodiment, a polarizing beam splitter 108 may be used in place of the polarizer 106 and analyzer 118. With the use of the quarter wave plate 116, the phase shift between the p- and s-wave is translated into intensity, which measures the polarization phase. Without the quarter wave plate 116, the polarization angle is converted into intensity. The optical detector 122 may be, e.g., a CCD or a CMOS based camera, or other appropriate two-dimensional detector array. For example, a high resolution CCD camera with 1334×1024 pixels and 12 bit, such as that produced by Hamamatsu Co may be used as the optical detector 122.

The optical detector 122, thus, produces optically detected data in response to the magnetization of the write pole and provides the optically detected data to a computer 130 via an optional frame grabber. The computer 130 receives, stores, and analyzes the optically detected data provided by the optical detector 122. The computer 130 includes a processor 132 with memory 134, as well as a user interface including e.g., a display 138 and input devices 140. A non-transitory computer-usable storage medium 142 having computer-readable program code embodied may be used by the computer 130 for causing the processor to control the device and to perform a desired analysis, as described herein. The data structures and software code for automatically implementing one or more acts described in this detailed description can be implemented by one of ordinary skill in the art in light of the present disclosure and stored, e.g., on a non-transitory computer readable storage medium 142, which may be any device or medium that can store code and/or data for use by a computer system such as processor 132. The computer-usable storage medium 142 may be, but is not limited to, magnetic and optical storage devices such as disk drives, magnetic tape, compact discs, and DVDs (digital versatile discs or digital video discs). A communication port 144 may also be used to receive instructions that are used to program the computer 130 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

As illustrated in FIG. 1, the device 100 further includes a probe card 124 that is configured to provide a current to the write head 112, which will induce magnetization of the write pole 114. The probe card 124 may be connected to the write head 112 using one or more probes 126, which may be, e.g., pogopins, probes, or other contacts such as wires that are wire bonded. The probe card 124 is coupled to current or voltage source 128, which is connected to and controlled by computer 130. The write head 112 may be in the form of a bar or slider, with which the probe card 124 may be used. If the write head 112 is in the form of a HGA (head gimbal assembly) or HSA (head stack assembly) an appropriate connector may be used in place of the probe card 124.

The device 100 may also include an auto focusing system 150 that includes a separate light source 152, which may be, e.g., a laser that produces light with a different wavelength than the light produced by light source 102. For example, focus light source 152 may produce light at 635 nm. The light from the focus light source 152 is provided to a collimator 154 and is transmitted by beam splitter 156. A dichroic beam splitter 158 is positioned to reflect light from the focus light source 152 to the write head 112. The dichroic beam splitter 158 transmits light from the light source 102. The return light is reflected by the dichroic beam splitter 158 and beam splitter 156 to a focus detector 160. The focus detector 160 maybe, e.g., a camera or a photo detector or a photo detector array combined with appropriate optics to generate an out-off-focus signal, e.g. a knife edge detector or a phase detector, that is coupled to the computer 130. The computer 130 may be coupled to a focus stage 162, which may be coupled to the objective lens 110 to alter the vertical (z) position of the objective lens 110. Alternatively, the computer 130 may control the vertical (z) position of the stage 164 that holds the write head 112. Additionally, a filter 166 is positioned between the lens 120 and the detector 122 to prevent the light from the focus light source 152 from entering the detector 122.

The focus of the device 100 may be achieved by focusing on a structure in the write head 112 that is larger than the resolution limit of the device and that has a known offset distance with respect to the write pole 114. For example, the focusing system 150 may focus on a shield or other large structure near the write pole 114 that is on the write head 112 or the slider. Because the structure is larger than the resolution limit of the optics in the device 100, by maximizing the differential edge contracts of the structure, the structure can be imaged (without use of a magnet-optic contrast) and the focus can be adjusted to place the structure at the vertical position that provides the sharpest image. The vertical position of the objective lens 110 (or write head 112) may then be adjusted by a vertical offset distance to place the write pole 114 at the best focal position, which may be performed automatically by programming the close loop focusing system with a previously established offset value. In some implementations, the vertical offset distance may be negligible and an offset distance of 0 nm may be used. Additionally, the horizontal position along the x-axis and y-axis of the stage 164 may be adjusted to align the write pole 114 along the optical axis of the device 100. Alternatively, if the write pole 114 is already in the field of view, no physical adjustment of the horizontal position may be necessary.

The vertical offset distance between the structure that is used for focusing and the write pole 114, however, is generally an approximation. Therefore, the focal position may be refined by measuring the write pole 114 using the device 100 at multiple vertical positions until a maximum intensity value of the magneto-optic contrast is generated and using the corresponding vertical position as the best focal position.

Figure 2:
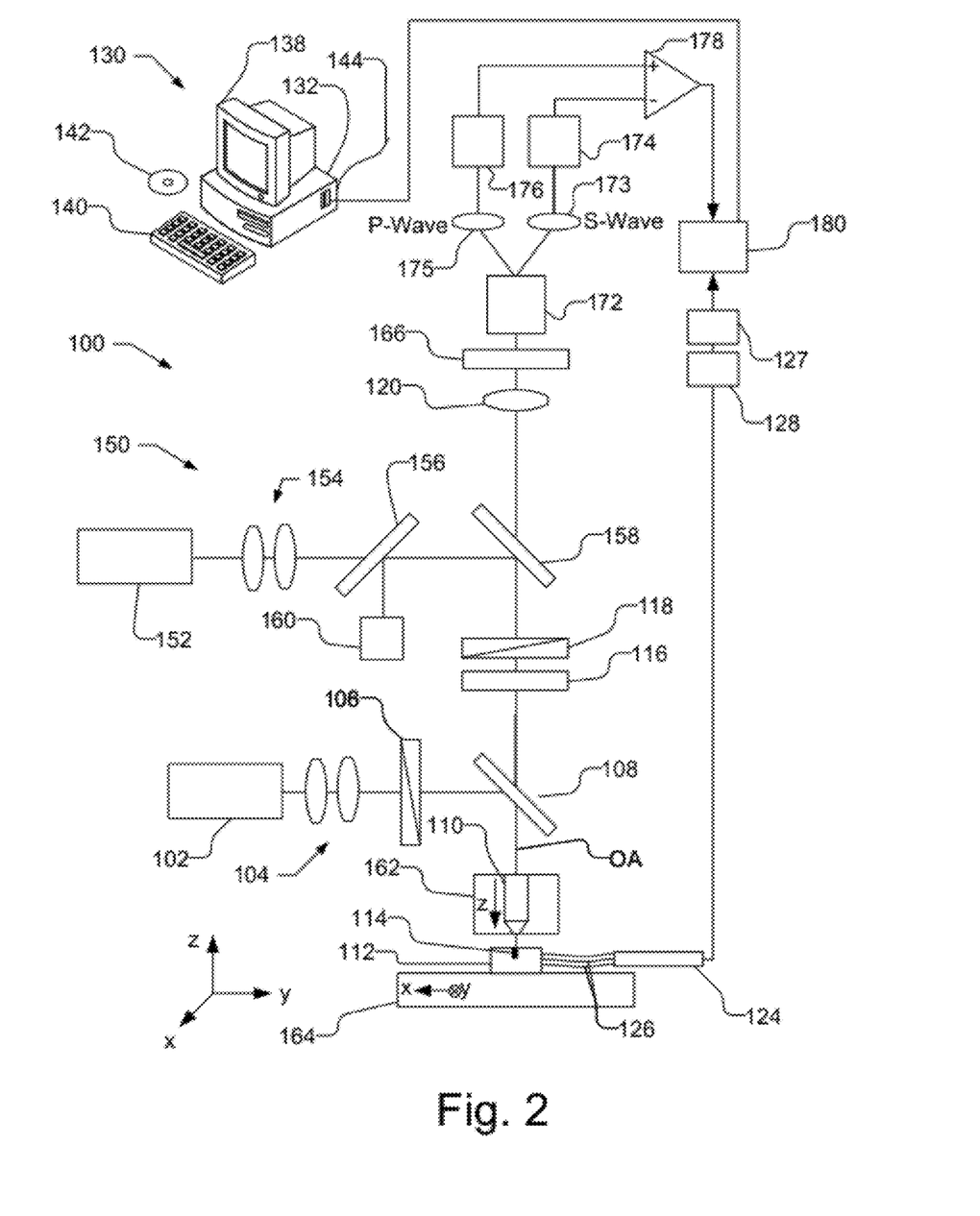
FIG. 2 illustrates an optical metrology device similar to that shown in FIG. 1, but with different optical detector.

FIG. 2 illustrates optical metrology device 100 with a different optical detector. As illustrated in FIG. 2, instead of a detector 122 with a two dimensional detector array, as described in FIG. 1, the device 100 may include a Wollaston prism 172 that separates the S and P polarization components of the light, which may be received by non-imaging detectors, such as photo-detectors 174 and 176, via lenses 173 and 175, respectively. If desired, the photo-detectors 174 and 176 may be coupled to a differential amplifier 178 and lock-in amplifier 180 and the write current source 128 provides a reference signal for the lock-in amplifier 180 to measure the polarization components of the reflected light, which is coupled to the computer 130. Non-imaging detectors may be used without lock-in amplifier 180 as well.

Figure 3:
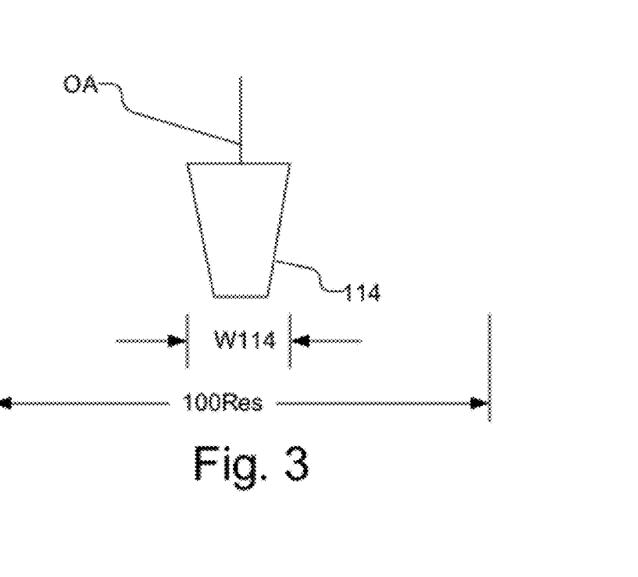
FIG. 3 illustrates the largest dimension of a write pole that is perpendicular to the optical axis of the metrology device in comparison to the resolution limit of the metrology device, which is, e.g., 5× the width of the write pole.

In operation, optical metrology device 100 measures a quality parameter of the write pole 114 or the entire write head even though the largest dimension of the write pole 114 that is perpendicular to the optical axis of the device 100 is smaller than the resolution limit of the device 100 and therefore the optics of the device 100 cannot produce an image of the write pole 114. FIG. 3 illustrates the largest dimension of the write pole 114 that is perpendicular to the optical axis of the device 100 in comparison to the resolution limit 100Res of the device 100. A write pole 114 typically has a trapezoidal shape with dimensions of e.g., 100 nm at one end, 30 nm at the other end and a height of 220 nm. Typically, a write pole 114 has a greatest dimension that is perpendicular to the optical axis, e.g., width W114, of approximately 100 nm. The resolution limit 100Res of the device 100, however, is much larger. Theoretically, the optical resolution limit of the optics of the device 100 is defined by the Rayleigh Criterion as:

$$r = \frac{0.61\lambda}{NA} \qquad \text{eq. 1}$$

where $\lambda$ is the wavelength of the incident light and NA is the numerical aperture of the objective lens. By way of example, at normal incidence with a wavelength of 442 nm and an objective numerical aperture of 0.9, the resolution limit 100Res is 300 nm, i.e., 3 times greater than the greatest dimension of the write pole 114. In practice, however, the actual optical resolution limit is even worse than that suggested by the theoretical limit, e.g., by 20% or more, due to factors such as spherical aberration of the objective lens and the illumination aperture.

Figure 4A:
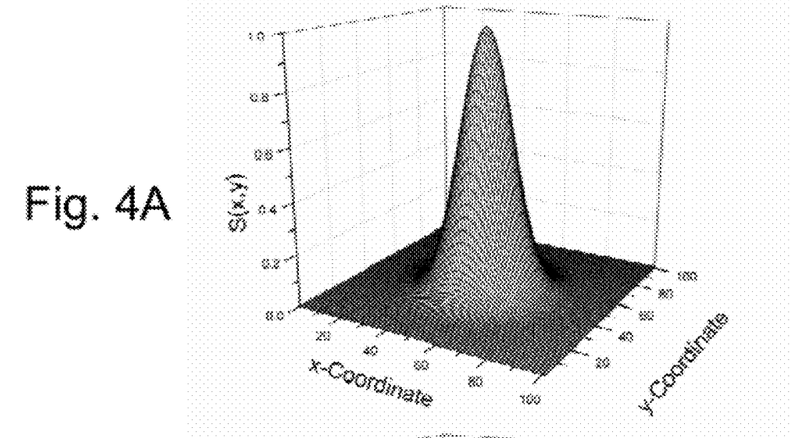
FIG. 4A illustrates a simplified Gauss point spread function of optics.
Figure 4B:
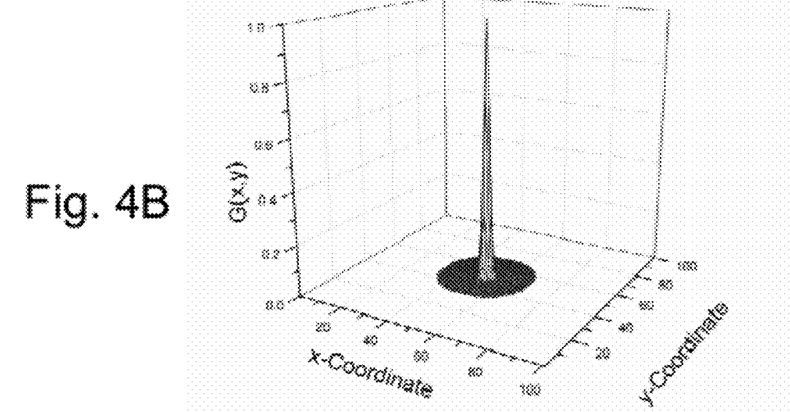
FIG. 4B illustrates a simplified two-dimensional Gauss function representing the object.
Figure 4C:
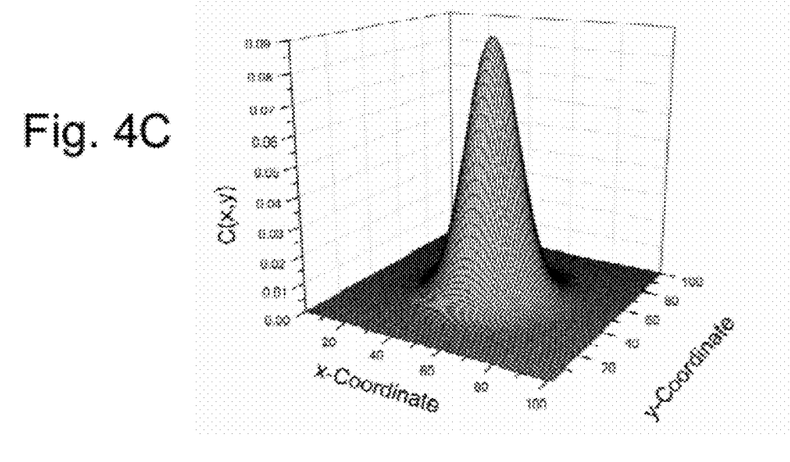
FIG. 4C illustrates the convolution of the Gauss point spread function of optics with the two-dimensional Gauss function representing the object.

Because the write pole 114 is much smaller than the resolution limit of the device, an attempt to image the write pole 114 results in an approximate image of the point spread function (PSF) of the optics of the metrology device 100. The PSF is the response of the optical system to a point light source, where the central peak of the PSF is sometimes referred to as the Airy Disk. The light intensity, as detected by the optical system of the optical metrology device 100, is determined by the convolution of the PSF and the geometry of the object, i.e., the write pole 114. To illustrate this point, reference is made to FIGS. 4A, 4B, and 4C which respectively illustrate a simplified Gaussian representation of the point spread function S(x,y), a simplified 2-D object Gaussian curve G(x,y), and the convolution C(x,y) of the simplified Gauss point spread function and the object represented by G(x,y). The simplified Gauss point spread function of FIG. 4A, may be written as:

$$S(x, y) = Ae^{-\left[\frac{(x-x_0)^2+(y-y_0)^2}{2\sigma^2}\right]} \qquad \text{eq. 2}$$

where $\sigma$ is the half-width. The simplified 2-D object Gaussian curve G(x,y) approximates the geometry of the write pole 114. The convolution C(x,y) of FIG. 4C is the light distribution that is detected by the optical system and may be written as:

$$C(x, y) = \int_{-\infty}^{+\infty}\int_{-\infty}^{+\infty} G(x_s, y_s)S(x-x_s, y-y_s)dx_s dy_s. \qquad \text{eq. 3}$$

Figure 5:
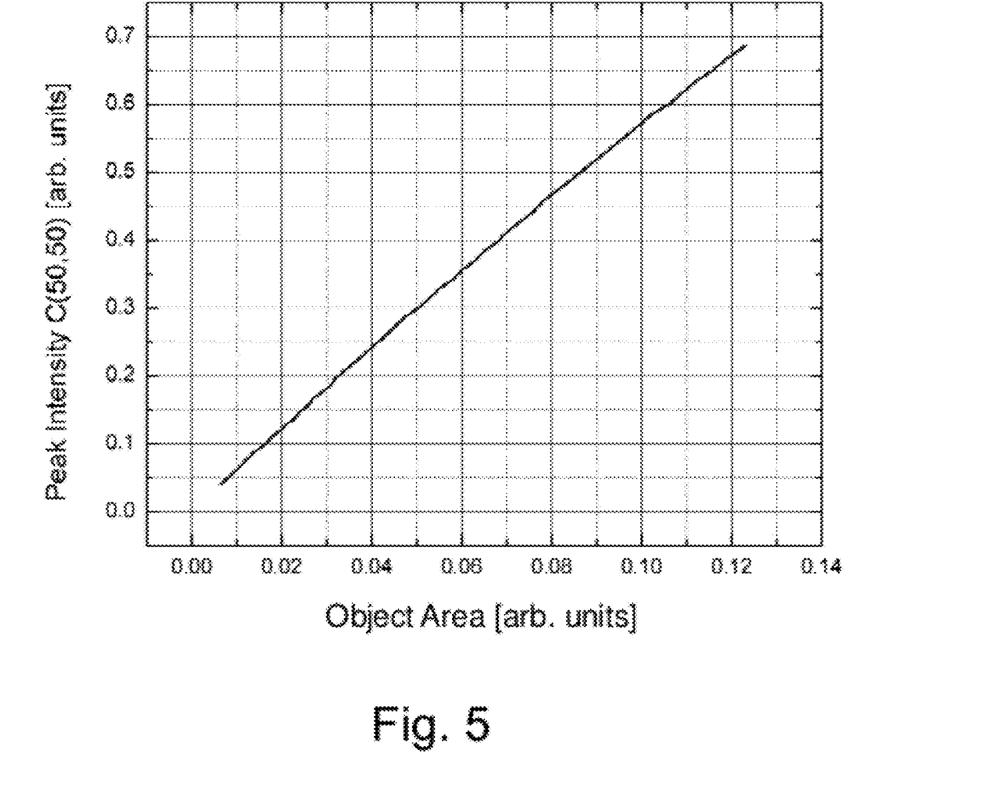
FIG. 5 is a graph illustrating the proportionality of the intensity produced by an object that is averaged over the area of the Airy disk or the peak intensity with respect to the area of the object.

Due to the convolution of the PSF and the geometry of the sub-resolution write pole 114, imaging of the write pole itself is not possible. The intensity measured over the area of the Airy disk or the peak intensity is proportional to the area of the object as illustrated in FIG. 5. FIG. 5 shows the dependence of the maximum of the convolution function C(x,y) on the area of an object for a range of the objects linear dimension from 0.08 to 0.349 times the optical resolution. While there is some relative dimensional information in the detected intensity, it is not possible to determine an absolute length as the shape of the object is not reproduced, i.e. it is not imaged. Nevertheless, the metrology device 100 can optically detect the polarization state of light reflected from the light pole after the light passes through analyzer 118 and use the polarization dependent light intensity to determine one or more quality parameters of the write pole.

Figure 6:
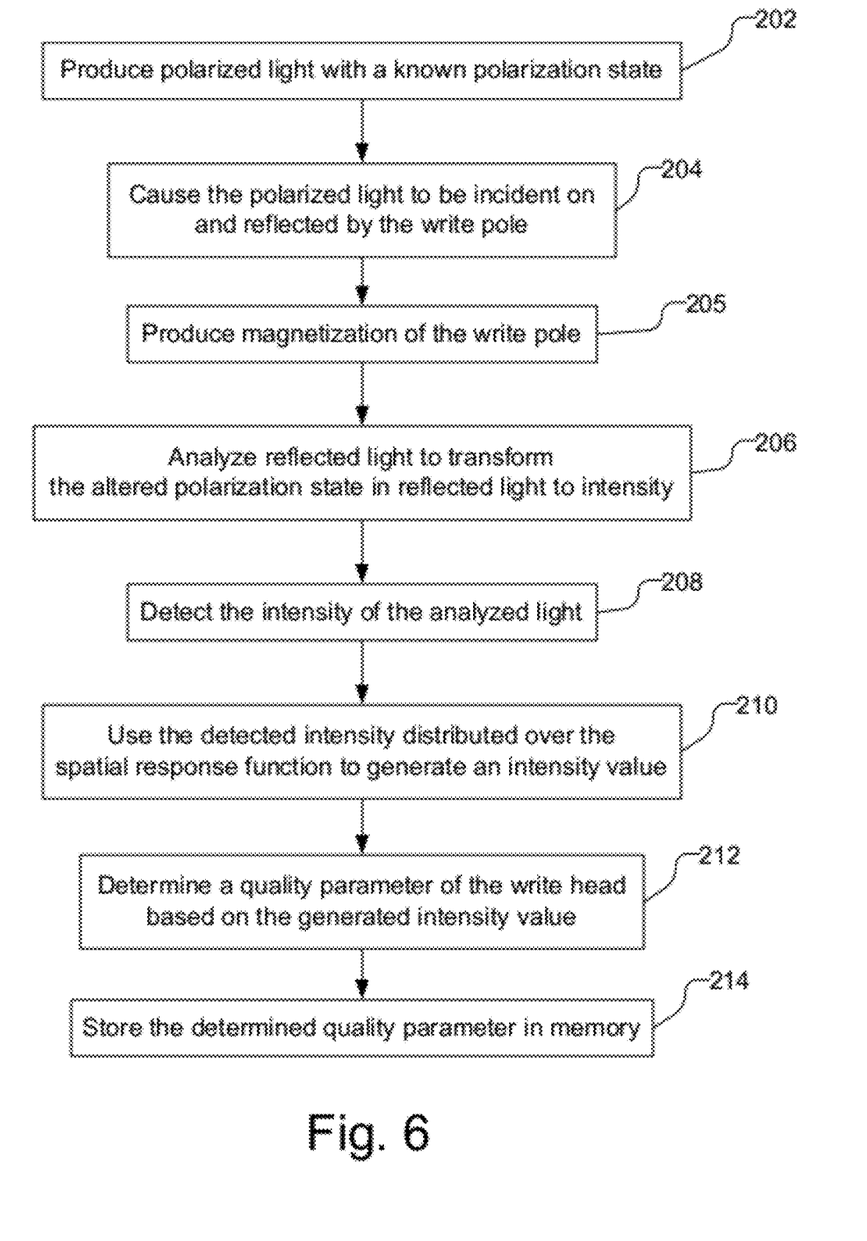
FIG. 6 is a flow chart illustrating an embodiment of determining a quality parameter of the write pole using an optical metrology device, where the write pole is smaller than the optical resolution limit.

FIG. 6 is a flow chart illustrating an embodiment of determining a property of the write pole 114 using an optical metrology device having an optical resolution limit with a point spread function, where the write pole 114 is smaller than the optical resolution limit. Once the write head is mounted on the stage, polarized light having a known polarization state is produced (202), e.g., by the light source 102 and the polarizer 106, which is caused to be incident on and reflected by the write pole 114 of the write head 112 (204), e.g., by the objective lens 110. A magnetization is produced in the write pole 114, e.g., by providing a write current to the write head 112, via current source 128 (205). The magnetization of the write pole 114 is produced while the polarized light beam is incident on the write pole 114, but, of course, the magnetization may be initiated before or after the light source 102 is turned on to produce the polarized light beam. The magnetization of the write pole will alter the polarization state of the incident polarized light beam so that the polarization state of the reflected light is different than the polarization state of the illuminating light beam, per the magneto-optic Kerr effect.

Figure 7:
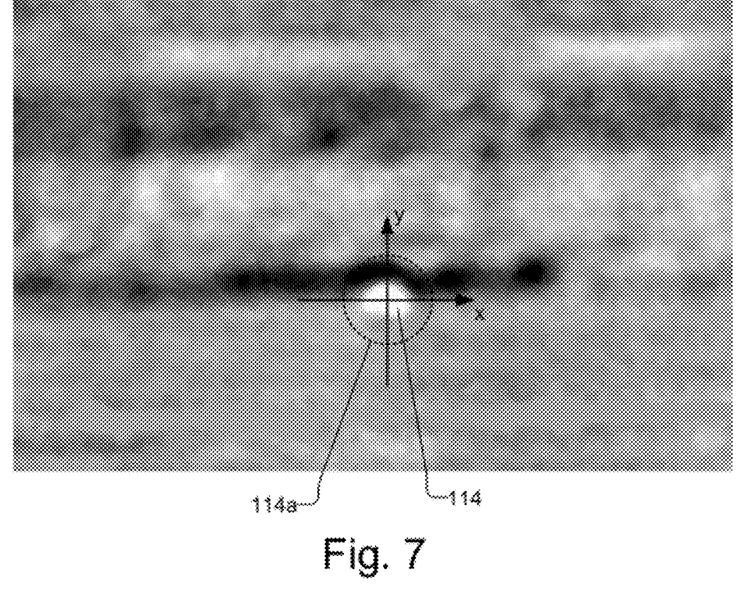
FIG. 7 illustrates a wide field Kerr image of a write head including a write pole.
Figure 8A:
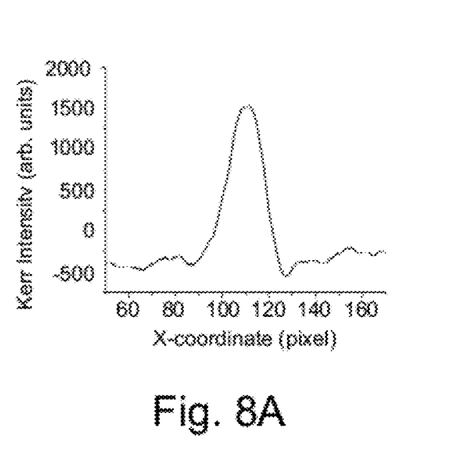
FIGS. 8A and 8B illustrate the intensity profile along the cross-track (x-axis) direction and down-track (y-axis) direction of the write pole shown in FIG. 7.
Figure 8B:
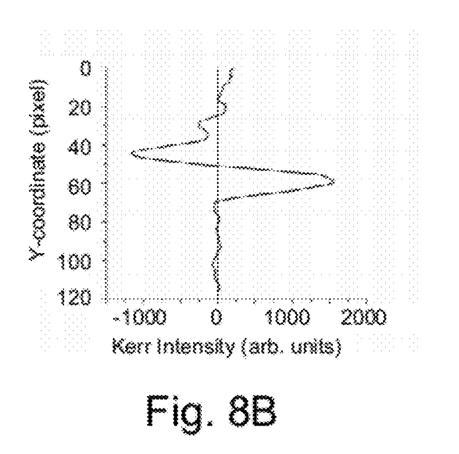

The reflected light is analyzed using the analyzer 118 to transform the altered polarization state of the reflected light into intensity distributed over the point spread function of the optical metrology device (206). The intensity of the light after the analyzer is then detected (208), e.g., using detector 122 in FIG. 1 or detectors 174 and 176 in FIG. 2. By way of example, FIG. 7 illustrates a wide field Kerr image of a write head, where the write pole 114 is located at the white circular feature and the edge of the write head shield is located at the black elongated feature. The dotted circular line 114a indicates the area that is illuminated by metrology device 100 when a focused light beam is used. FIG. 8A illustrates the intensity profile along the cross-track (x-axis) direction of the write pole shown in FIG. 7, while FIG. 8B illustrates the intensity profile along the down-track (y-axis) direction. FIG. 8A is an example of the intensity profile determined by the point spread function of the optics of the metrology device. Because the shape of the curve in FIG. 8A is not determined by the shape of the write pole 114 by itself but is a convolution with the point spread function of the optics themselves, the shape of the curve in FIG. 8A does not represent the shape of the write pole 114. However, the intensity is the result of the magnetization of the write pole 114 and, thus, may be used to determine a quality parameter of the write pole 114. While each magnetized portion of a write head, e.g., the return pole/shield and other components may have a different measured intensity, it is expected that the write pole will have the largest intensity. With these intensities sufficiently spaced apart in the optical resolution of the optical metrology device, the intensities of the independent features may be recognized.

Using the detected intensity distributed over the point spread function, an intensity value is generated (210). A useful intensity value may be generated by, e.g., measuring a peak value of the intensity or averaging the intensity over a region that includes the peak value, the region may be limited to intensities that are greater than a threshold. Alternatively, an intensity value may be produced by combining a plurality of intensity values over the point spread function, e.g., by summing the peak value, along with a number of intensity values along the curve. Other methods of generating an intensity value may be used as well.

The generated intensity value is used to determine a quality parameter of the write pole (212), such as write-field strength, write-field saturation, head efficiency as determined by the field-strength to current dependence, etc. If desired, the intensity value may be related to magnetized areas of the write head other than the write pole, i.e., intensities at various positions around the write pole may be also or alternatively measured. To determine the quality parameter, the intensity value may be compared to a threshold, a reference value, or a library of information, which may be produced empirically or theoretically by modeling. For example, the generated intensity value for a write head under test may be compared to a similarly generated intensity value for a known good write head, where the determined quality parameter can then be stored in memory (214), e.g., memory 134 in processor 130 or otherwise reported, e.g., displayed by display 138. It should be understood that storing the determined quality parameter in memory may be long term storage of data or it may be temporarily stored, for example, in order to display the result on a monitor or print the result. The quality parameter can be used to, e.g., accept or reject samples with unsatisfactory characteristics or to separate, e.g., bin, samples based on performance. Further, the determined quality parameter may be used in process feedback control in the production of samples. Additionally, the determined quality parameter may be used in the evaluation and/or comparison of sample designs.

If desired, the magnetization of the write pole 114 may be optically detected when different write currents are applied to the write head 112.

Figure 9A:
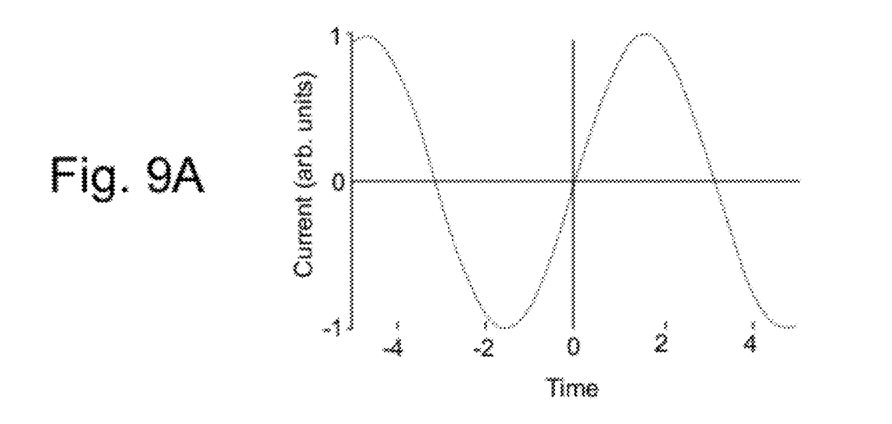
FIGS. 9A, 9B, and 9C respectively illustrate a varying write current, the signal components originating from the write pole and the signal components originating from the shield of the write head when synchronous detection is used.
Figure 9B:
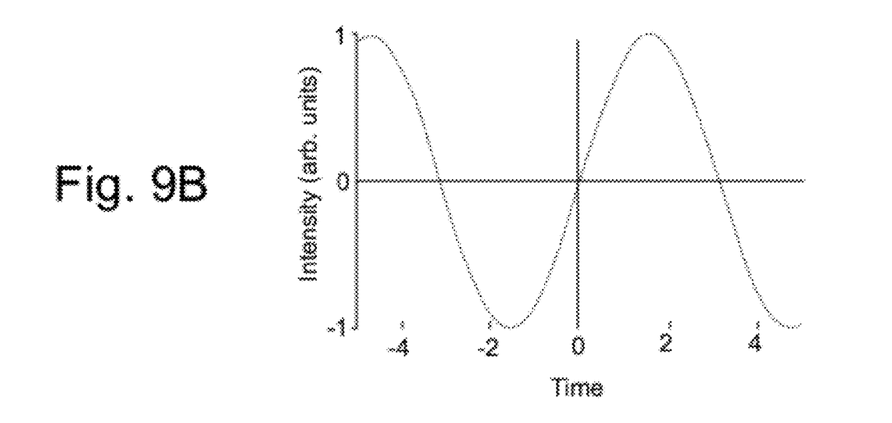
Figure 9C:
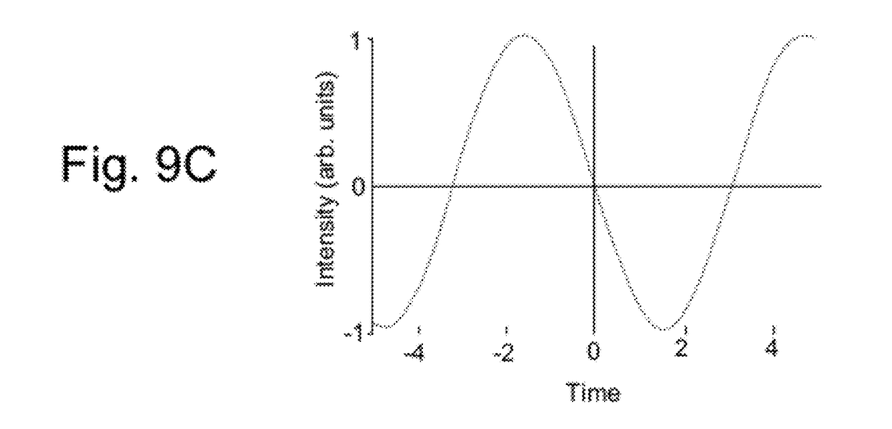

Alternatively a lock-in amplifier 180, shown in FIG. 2, is used for signal detection along with the photo-detectors 174, 176, and a varying write current, the signal components originating from the write pole can be easily distinguished. By way of example, FIGS. 9A, 9B, and 9C respectively illustrate a varying write current, the signal components originating from the write pole (i.e., the white area of FIG. 7) that is in phase with the write current ($\phi=0$), and the signal components originating from the shield of the write head (i.e., the black area of FIG. 7) that is out of phase with the write current ($\phi=\pi$). If desired, instead of performing a periodic synchronous testing using a lock-in amplifier 180, non-imaging detector(s) perform a DC write current analysis without the lock-in amplifier 180.

Additionally, to increase the magneto-optic contrast, the magnetization of the write pole 114 may be optically detected for negative and positive write currents and the two optically detected magnetizations are subtracted to eliminate light that has no magnetic information, which can also be done for different absolute magnitude write currents. Further, if desired, the magnetization of the write pole 114 may be optically detected for zero write current, which may then be subtracted from subsequent optical detections of magnetizations to eliminate light that has no magnetic information, which can also be done for different absolute magnitude write currents. Further, the intensity value may be detected for different write current values. Additionally, if desired, the magnetization of the write pole 114 may be optically detected while exercising a Dynamic Fly Height device or a microactuator device that may be present on a write head.

Figure 10:
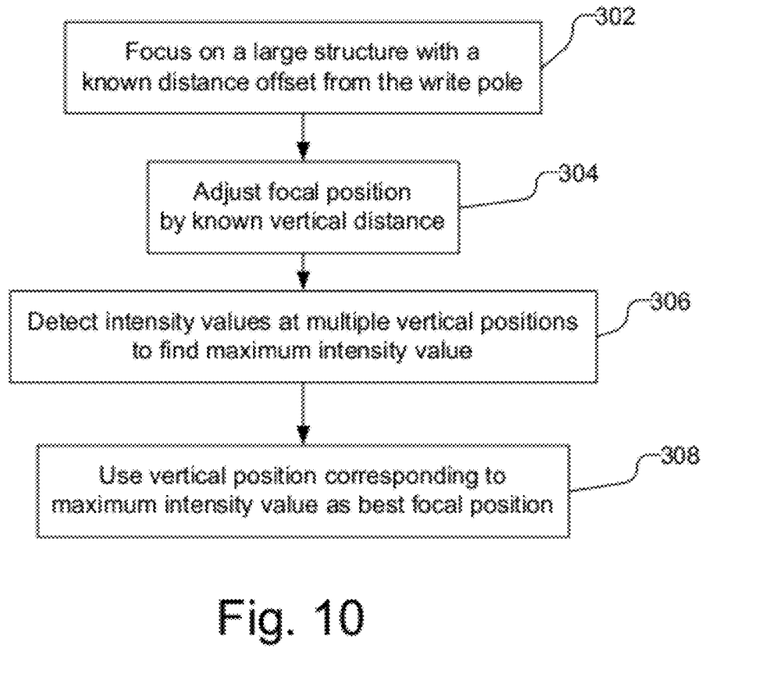
FIG. 10 is a flow chart illustrating the process of focusing the metrology device on the write pole.

FIG. 10 is a flow chart illustrating the process of focusing the metrology device on the write pole 114. The metrology device is focused on a feature that is larger than the optical resolution limit of the optics and that has a known offset distance (e.g., horizontal offset distance and/or vertical offset distance) from the surface of the write pole (302). For example, the metrology device may focus on the shield of the write head. The focal position of the metrology device may then be adjusted by the known vertical offset distance (304) to produce a rough focal position. The positioning accuracy for maximum magneto-optic contrast is typically 100 nm or larger. The vertical offset distance in some instances may be negligible, because the positioning accuracy (100 nm) may be much greater than the height difference between the write head feature used for focus and the feature to be measured (which may be 5 nm), and thus, a vertical offset distance of 0 nm may be used. The horizontal position of the write head may be adjusted by the horizontal offset distance to align the write pole with the optical axis, e.g., by controlling the stage 164. Alternatively, if the write pole is already in the field of view of the objective lens 110, no physical adjustment of the horizontal position may be necessary. To refine the focal position, the metrology device may generate intensity values for the write pole, as discussed above, at multiple vertical positions that are near the rough focal position until a maximum intensity value is obtained (306). The focal position that corresponds with the maximum intensity value is used as the best focal position (308).

Figure 11:
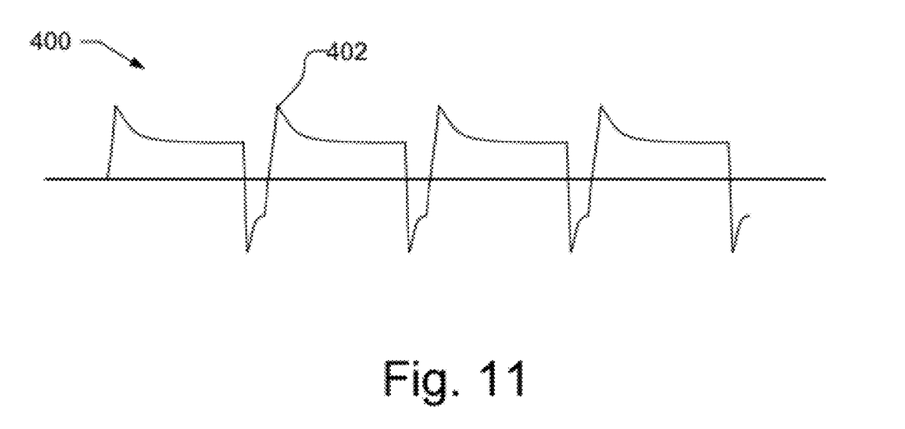
FIG. 11 illustrates a write current waveform with a positive RMS value.

In addition, it may be desirable to measure the effect of AC current and particularly overshoot in the write current waveform on the magnetization response and the remanent magnetization of the write head. One method of measuring the effects on the magnetization response of the write head includes producing magnetization of the write pole 114 (step 205 in FIG. 6) using a high frequency AC current with overshoot, e.g., using a probe card 124 and a typical write driver pre-amp chip including the voltage or current source 128 as used in the HDD industry, and controlled by a write waveform generator 127 shown in FIGS. 1 and 2, which is programmed by computer 130. The duty cycle of the AC current is controlled by waveform generator 127 so that, e.g., it is not at 50% duty cycle. For example, the duty cycle of the AC current may be 90%, or other percentage, which as illustrated in FIG. 11, will produce a mostly positive write current waveform with a positive RMS value. As shown in FIG. 11 the AC current 400 includes overshoot 402. The high frequency AC current 400, e.g., may have a frequency of, e.g., 100-300 MHz. The exposure period for the detector 122 in FIG. 1 or the integration time of detectors 174 and 176 in FIG. 2, may be on the order of a 1 ms. Thus, the AC current 400 will include many cycles, e.g., $10^5$, during the exposure period. With a 90% positive duty cycle, the positive magnetization response may be measured, while with a 90% negative duty cycle, the negative magnetization response may be measured. If desired, the write waveform generator 127 may be programmed to alter the number of overshoot occurrences during an exposure by changing the frequency of the AC current 400, and also the duty cycle may be altered. Additionally, the magnitude and/or duration of the overshoot may be varied through control of the write driver pre-amp chip.

Figure 12:
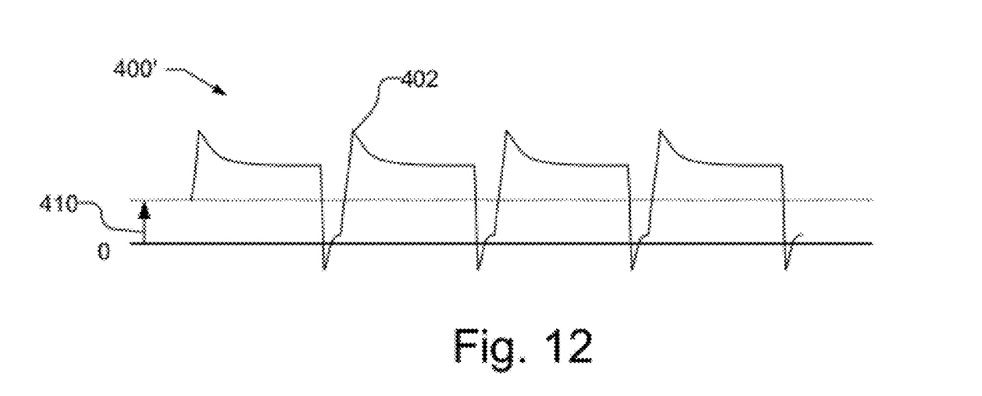
FIG. 12 illustrates the effect of a bias current on a write current waveform with a positive RMS value.

If desired, a bias current may be applied to the write head, e.g., using a bias-T circuit 129 in the current source 128. With a 30 mA write current, by applying, e.g., a +30 mA, bias current offset, the positive write current amplitude is increased to 60 mA, while the negative write current will be 0 mA, excluding effects of the overshoot. FIG. 12 illustrates the effect of a bias current 410 on an AC write current 400'. Additionally, a negative bias current offset, e.g., −30 mA, may be applied to produce a 60 mA negative write current and a 0 mA positive write current. If desired, the bias currents applied need not match the write current.

If the current source 128 has very high frequency overshoot characteristics, such as 100 ps timing as may be possible with a typical write driver pre-amp chip, it may be desirable to use a probe card 124 and a bias-T circuit 129 (FIG. 1) in the current source 128 with RF characteristics, so that the RF overshoot waveform is passed all the way to the write pole without signal distortion.

Figure 13:
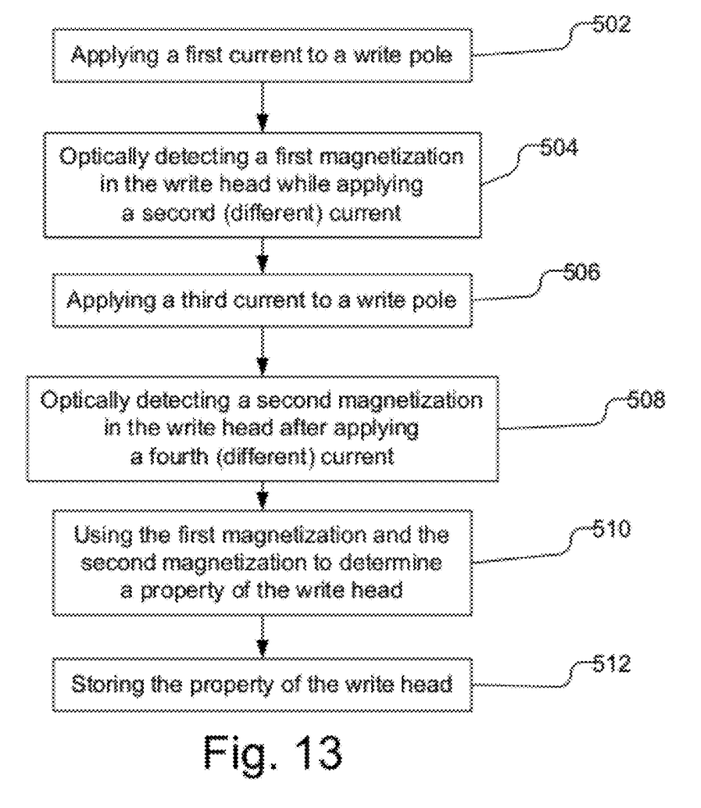
FIG. 13 is a flow chart illustrating determining a property of a write head, such as remanence.

Additionally, remanence in the write head may be measured. For example, as illustrated in FIG. 13, remanence may be measured by applying a first current to the write head (502) and optically detecting a first magnetization of the write head while applying a second current that is different than the first current (504). By way of example, the second current may have zero magnitude. The first current may be a positive DC current or AC write current waveform with a positive RMS value or that ends with a positive pulse, and thus, the magnetization is referred to herein as Positive Remanence. A third current to the write head is applied (506) and a second magnetization of the write head is optically detected while applying a fourth current, which is different than the third current (508). As with the first current, the third current may be a DC or AC write current. The third current is different than the first current, and may have opposite polarity, i.e., the third current may be negative, and thus, the magnetization is referred to as Negative Remanence. However, the third current may also be a positive current if desired. The first magnetization and the second magnetization are then used to determine the desired property of the write head, such as remanence (510), and the property is stored (512). For example, the difference between the Positive Remanence and Negative Remanence measurements provides a measure of remanence, where no difference between measurements represents no remanence. A reference remanence may be compared to the Positive Remanence and the Negative Remanence or the difference between the Positive Remanence and the Negative Remanence. The reference remanence may be generated for each write head, e.g., as described below, or may be stored in memory. It should be understood that the optically detected magnetizations may be represented as intensity values of the detected light.

The effect of overshoot on remanence may also be measured. For example, as discussed above, the applied positive current (502) may be an AC write current with the last pulse of write current that is applied being positive, followed by optically detecting the magnetization when no write current is applied to a write head to get Positive Remanence. Similarly, the applied negative current (506) may be an AC write current with the last pulse of write current that is applied being negative, followed by optically detecting the magnetization when no write current is applied to a write head to get Negative Remanence. Alternatively, the write current waveforms could be a single positive or negative pulse with or without overshoot. The difference between the two measurements can then provide a measure of remanence. With the use of the AC write current, the effect of overshoot on remanence may be detected. If desired, a 50% duty cycle may be used, but other duty cycles may be used as well and the frequency of this AC write waveform may be varied. Further, the magnitude and/or duration of the overshoot may be altered.

Figure 14:
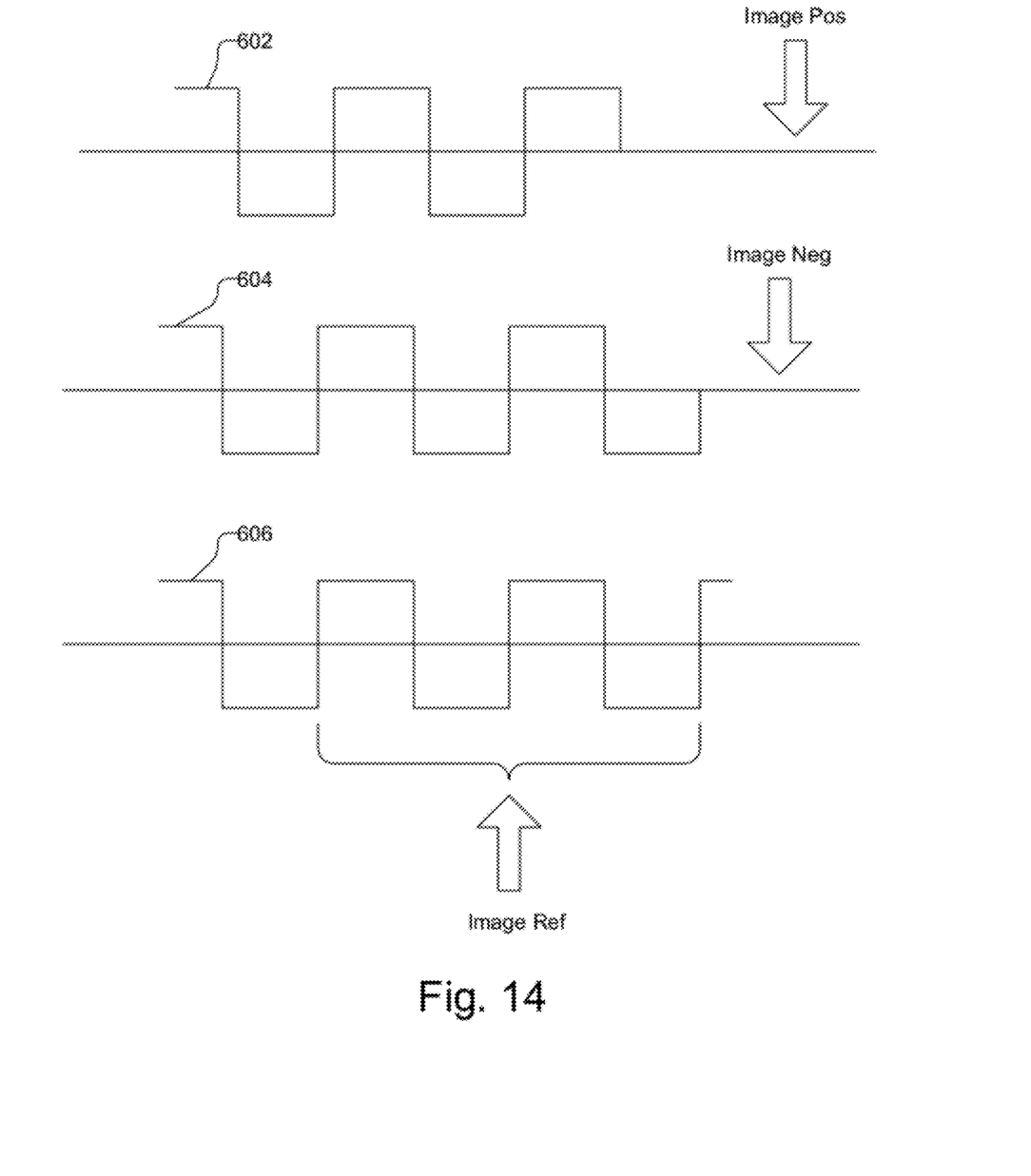
FIG. 14 illustrates a number of AC write current waveforms and when images of the magnetization of the write head are captured.

If desired, optical detection of the magnetization may be performed during the application of the AC write current to produce a reference for the remanence. FIG. 14 for example, illustrates an AC write current waveform 602 that ends with a positive pulse, followed by an image Pos being generated. Another AC write current waveform 604 is illustrated as ending with a negative pulse, followed by an image Neg being generated. Another AC write current waveform 606 is illustrated with a 50% duty cycle, where image Ref is generated during the waveform. It should be understood that the image Ref may be produced during either waveform 602 or 604. Moreover, the duration of the write current waveforms 602 and 604 need not be equal, i.e., after image Pos is produced, a single negative pulse may be applied followed by image Neg. During a 50% duty cycle, the detected magnetization should be zero if the acquisition period is averaged over an integer number of cycles, or if the acquisition period, e.g., 1 ms, is significantly longer than the cycle frequency, e.g., 1 µs. The reference magnetization from image Ref may be compared to both the Positive Remanence from image Pos and the Negative Remanence from image Neg. Additionally, the reference magnetization from image Ref from AC write current excitation may then be compared to the difference between the Positive Remanence from image Pos and Negative Remanence from image Neg. The reference magnetization may be produced with a 50% duty cycle, or a different duty cycle, e.g., 90% positive duty cycle to compare with the positive remanence and a 90% negative duty cycle to compared with the negative remanence. Additionally, with an AC write-current excitation, it may be advantages to synchronize the camera frame acquisition to the write current timing. For example the timing could be such that the current over-shoot occurs while an image is acquired or before the image is acquired.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of determining a quality parameter of a write pole of a write head using an optical metrology device having an optical resolution limit expressed by a point spread function, the method comprising:
producing a polarized light beam with a polarization state;
causing the polarized light beam to be incident on and reflected by the write pole, the write pole being smaller than the optical resolution limit of the optical metrology device so that a light intensity from the write pole that is detected by the optical metrology device is determined by the point spread function;
producing a magnetization of the write pole, reflected light from the write pole having an altered polarization state that is different than the polarization state of the polarized light beam, the write pole being smaller than the optical resolution limit of the optical metrology device;
analyzing the reflected light to transform the altered polarization state into an intensity;
detecting the intensity of the analyzed light;
generating an intensity value based on the intensity distributed over the point spread function;
determining the quality parameter of the write pole based on the intensity value; and
storing in memory the quality parameter.

2. The method of claim 1, wherein producing the magnetization of the write pole comprises applying a current to the write head.

3. The method of claim 2, wherein the current applied to the write head is from one of a probe card, pogopins, and a connector, coupled to a programmable bias source.

4. The method of claim 3, wherein the probe card can change a polarity of the current.

5. The method of claim 2, further comprising determining the intensity value as a function of the current applied to the write head.

6. The method of claim 5, further comprising determining intensity values at multiple current values.

7. The method of claim 6, wherein the multiple current values have opposite polarity.

8. The method of claim 1, wherein determining the quality parameter comprises comparing the intensity value to at least one of a threshold intensity value and a reference intensity value.

9. The method of claim 8, wherein the at least one of the threshold intensity value and the reference intensity value is produced empirically or by modeling.

10. The method of claim 1, wherein generating the intensity value comprises at least one of measuring a peak value of an intensity distribution over the point spread function, measuring a plurality of intensity values of the intensity distribution over the point spread function, averaging the intensity over a region that includes the peak value, and averaging the intensity that is greater than a threshold.

11. The method of claim 1, further comprising focusing the optical metrology device on the write pole by focusing the optical metrology device on a feature that is larger than the optical resolution limit.

12. The method of claim 1, further comprising generating intensity values based on an intensity distribution over the point spread function at multiple vertical positions until a maximum intensity value is generated and using a vertical position that corresponds to the maximum intensity value as a focal position of the optical metrology device.

13. The method of claim 1, wherein the optical resolution limit is defined by wavelength of light and optical characteristics of the optical metrology device.

14. The method of claim 1, wherein a largest linear dimension of the write pole is along a plane perpendicular to an optical axis of the optical metrology device and the largest linear dimension is smaller than the optical resolution limit.

15. The method of claim 1, wherein detecting the intensity of the analyzed light comprises:
detecting a first intensity of analyzed reflected light from the write pole when a first current is applied;
detecting a second intensity of analyzed reflected light from the write pole when a second current is applied; and
subtracting the first intensity and the second intensity.

16. The method of claim 15, wherein the first current and the second current are equal in magnitude and opposite in polarity.

17. The method of claim 15, wherein one of the first current and the second current is zero.

18. The method of claim 1, wherein the intensity of the analyzed light is detected with a two dimensional detector.

19. The method of claim 1, wherein the intensity of the analyzed light is detected with a photodetector.

20. The method of claim 1, wherein causing the polarized light beam to be incident on the write pole comprises focusing the polarized light onto an area of the write head that includes the write pole.

21. The method of claim 2, further comprising using a lock-in amplifier to detect in-phase and out-of phase components referenced to the current applied to the write head.

22. The method of claim 1, wherein analyzing the reflected light to transform the altered polarization state into the intensity uses polarization phase or polarization angle.

23. The method of claim 1, wherein the write head is one of a bar, slider, head gimbal assembly or head stack assembly.

24. The method of claim 2, wherein applying the current to the write head comprises applying an AC current with overshoot to the write head.

25. The method of claim 24, wherein a frequency and a positive-vs-negative duty cycle in the AC current are variable.

26. The method of claim 1, wherein detecting the intensity of the analyzed light comprises:
detecting a first intensity of analyzed reflected light from the write pole after applying a positive current;
detecting a second intensity of analyzed reflected light from the write pole after applying a negative current; and
using the first intensity and the second intensity to determine remanence.

27. An apparatus for determining a property of a write pole of a write head, the apparatus comprising:
a light source that produces a light beam;
a polarizer in a path of the light beam and generates a polarized light beam;
optical elements that cause the polarized light beam to be incident on and reflected by the write pole, the optical elements having an optical resolution limit, the write pole being smaller than the optical resolution limit;
an electrical energy source that is configured to be coupled to the write head to produce a magnetization of the write pole while the polarized light beam is incident on and reflected by the write pole;
a polarization state analyzer in a path of reflected light from the write pole;
at least one light detector in the path of the reflected light with the polarization state analyzer between the at least one light detector and the write head and produces optically detected data in response to the magnetization of the write pole; and a processor coupled to receive the optically detected data from the at least one light detector, the processor configured to determine the property of the write pole based on the optically detected data from the at least one light detector.

28. The apparatus of claim 27, wherein the electrical energy source is a current source that applies a current to the write head to produce the magnetization of the write pole.

29. The apparatus of claim 27, further comprising one of a probe card, pogopins, and a connector to couple the electrical energy source to the write head.

30. The apparatus of claim 27, wherein the electrical energy source further comprises a programmable bias source.

31. The apparatus of claim 27, wherein the processor is further configured to generate an intensity value based on the optically detected data distributed over a point spread function produced by the optical elements, wherein the processor is configured to determine the property of the write pole based on the optically detected data from the at least one light detector by being configured to use the intensity value to determine the property of the write pole.

32. The apparatus of claim 27, wherein the processor is coupled to the electrical energy source, the processor being configured to cause the electrical energy source to apply a first current to the write head to produce a first magnetization, apply a second current to the write head to produce a second magnetization, the second current being different than the first current, wherein the optically detected data received by the processor is in response to the second magnetization.

33. The apparatus of claim 32, wherein the second current has zero magnitude.

34. The apparatus of claim 32, wherein the property is remanence.

35. The apparatus of claim 32, wherein the first current comprises an AC current with overshoot that ends with one of a positive current and a negative current.

36. The apparatus of claim 35, wherein a frequency and a positive-vs-negative duty cycle in the AC current are variable.

37. The apparatus of claim 32, wherein the processor is configured to determine the property of the write pole based on the optically detected data from the at least one light detector by being configured to use a comparison with reference data.

38. The apparatus of claim 32, the processor being further configured to cause the electrical energy source to apply a third current to the write head to produce a third magnetization, the third current being different than the first current; apply a fourth current to the write head to produce a fourth magnetization, the fourth current being different than the third current; wherein the at least one light detector produces a second optically detected data in response to the fourth magnetization of the write pole, the processor is configured to receive the second optically detected data, wherein the processor is configured to determine the property of the write pole based on the optically detected data and the second optically detected data.

39. The apparatus of claim 38, wherein the processor is configured to determine the property of the write pole based on the optically detected data and the second optically detected data by being configured to compare reference data to the optically detected data and the second optically detected data.

40. The apparatus of claim 38, wherein the third current comprises applying an AC current with overshoot ending with one of a positive current and a negative current.

41. The apparatus of claim 38, wherein the processor is configured to determine the property of the write pole based on the optically detected data and the second optically detected data by being configured to compare the optically detected data and the second optically detected data.

42. The apparatus of claim 27, wherein the write head is one of a bar, slider, head gimbal assembly or head stack assembly.

43. A method comprising:
applying a first current to a write head;
applying a second current to the write head, the second current being different than the first current;
optically detecting a first magnetization of the write head while applying the second current;
using the first magnetization to determine a property of the write head; and
storing the property of the write head.

44. The method of claim 43, wherein the second current has zero magnitude.

45. The method of claim 43, wherein the property is remanence.

46. The method of claim 43, wherein applying the first current to the write head comprises applying an AC current with overshoot to the write head ending with one of a positive current and a negative current.

47. The method of claim 46, wherein a frequency and a positive-vs-negative duty cycle in the AC current are variable.

48. The method of claim 43, wherein using the first magnetization to determine the property of the write head comprises comparing a reference magnetization to the first magnetization.

49. The method of claim 48, further comprising generating the reference magnetization by optically detecting the reference magnetization of the write head while applying an AC current to the write head.

50. The method of claim 48 wherein the reference magnetization is a stored reference magnetization.

51. The method of claim 43, wherein optically detecting the first magnetization of the write head while applying the second current comprises:
producing a polarized light beam with a first polarization state;
causing the polarized light beam to be incident on and reflected by the write head while applying the second current to the write head to produce the first magnetization of the write head, reflected light from the write head having a second polarization state that is different than the first polarization state;
analyzing the reflected light to transform the second polarization state into an intensity; and
detecting the intensity of the analyzed light;
wherein using the first magnetization to determine a property of the write head comprises using the intensity of the analyzed light to determine the property of the write head.

52. The method of claim 51, further comprising generating an intensity value based on the intensity distributed over a point spread function, wherein using the intensity of the analyzed light comprises using the intensity value to determine the property of the write head.

53. The method of claim 51, wherein detecting the intensity of the analyzed light comprises detecting the intensity of the analyzed light from one of a write pole and a magnetized feature of the write head other than the write pole.

54. The method of claim 43, further comprising:
applying a third current to the write head, the third current being different than the first current;
applying a fourth current to the write head, the fourth current being different than the third current;
optically detecting a second magnetization of the write head while applying the fourth current; and
using the first magnetization and the second magnetization to determine the property of the write head.

55. The method of claim 54, wherein using the first magnetization and the second magnetization to determine the property of the write head comprises comparing a reference magnetization to the first magnetization and the second magnetization.

56. The method of claim 54, wherein applying the third current to the write head comprises applying an AC current with overshoot to the write head ending with one of a positive current and a negative current.

57. The method of claim 54, wherein the first magnetization and the second magnetization are represented as intensity values of detected light.

58. The method of claim 54, wherein using the first magnetization and the second magnetization to determine the property of the write head comprises comparing the first magnetization and the second magnetization.

59. The method of claim 43, wherein the write head is one of a bar, slider, head gimbal assembly or head stack assembly.

60. An apparatus comprising:
an optical metrology device capable of optically detecting magnetization of a write head;
an electrical energy source that is configured to be coupled to the write head to produce a magnetization of the write pole; and
a processor coupled to the optical metrology device and the electrical energy source, the processor configured to cause the electrical energy source to apply a first current to the write head; to cause the electrical energy source to apply a second current to the write head, the second current being different than the first current, to cause the optical metrology device to optically detect a first magnetization of the write head while the second current is applied; to use the first magnetization to determine a property of the write head; and to store the property of the write head in a memory.

61. The apparatus of claim 60, wherein the second current has zero magnitude.

62. The apparatus of claim 60, wherein the property is remanence.

63. The apparatus of claim 60, wherein the processor causes the electrical energy source to apply the first current to the write head as an AC current with overshoot ending with one of a positive current and a negative current.

64. The apparatus of claim 63, wherein a frequency and a positive-vs-negative duty cycle in the AC current are variable.

65. The apparatus of claim 60, wherein the processor is configured to use the first magnetization to determine the property of the write head by being configured to compare a reference magnetization to the first magnetization.

66. The apparatus of claim 65, wherein the processor is further configured to generate the reference magnetization by being configured to cause the optical metrology device to optically detect the reference magnetization of the write head causing the electrical energy source to apply an AC current to the write head.

67. The apparatus of claim 65, wherein the reference magnetization is a stored reference magnetization.

68. The apparatus of claim 60, wherein the optical metrology device comprises:
a polarized light beam generator that produces a polarized light beam with a first polarization state that is incident on the write head and reflected by the write head, wherein reflected light from the write head has a second polarization state that is different than the first polarization state;
a polarization state analyzer in a path of reflected light from the write head that transforms the second polarization state into an intensity of analyzed light;
at least one light detector in the path of the reflected light after the polarization state analyzer that detects the intensity of the analyzed light;
wherein the processor is configured to use the first magnetization to determine a property of the write head by being configured to use the intensity of the analyzed light to determine the property of the write head.

69. The apparatus of claim 68, wherein the processor is further configured to generate an intensity value based on the intensity distributed over a point spread function, wherein the processor is configured to use the intensity of the analyzed light by being configured to use the intensity value to determine the property of the write head.

70. The apparatus of claim 68, wherein the intensity of the analyzed light is from one of a write pole and a magnetized feature of the write head other than the write pole.

71. The apparatus of claim 60, wherein the processor is further configured to cause the electrical energy source to apply a third current to the write head, the third current being different than the first current; to cause the electrical energy source to apply a fourth current to the write head, the fourth current being different than the third current; to cause the optical metrology device to optically detect a second magnetization of the write head while the fourth current is applied; and to use the first magnetization and the second magnetization to determine the property of the write head.

72. The apparatus of claim 71, wherein the processor is configured to use the first magnetization and the second magnetization to determine the property of the write head by being configured to compare a reference magnetization to the first magnetization and the second magnetization.

73. The apparatus of claim 71, wherein the processor causes the electrical energy source to apply the third current to the write head as an AC current with overshoot ending with one of a positive current and a negative current.

74. The apparatus of claim 71, wherein the first magnetization and the second magnetization are represented as intensity values of light detected by the optical metrology device.

75. The apparatus of claim 71, wherein the processor is configured to use the first magnetization and the second magnetization to determine the property of the write head by being configured to compare the first magnetization and the second magnetization.

76. The apparatus of claim 60, wherein the write head is one of a bar, slider, head gimbal assembly or head stack assembly.

* * * * *